US009618558B2

(12) United States Patent
Yoshida

(10) Patent No.: US 9,618,558 B2
(45) Date of Patent: Apr. 11, 2017

(54) MOTOR DRIVING APPARATUS INCLUDING LIFE DETERMINING UNIT OF DIRECT-CURRENT CAPACITOR

(71) Applicant: FANUC CORPORATION, Yamanashi (JP)

(72) Inventor: Tomokazu Yoshida, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 0 days.

(21) Appl. No.: 15/071,476

(22) Filed: Mar. 16, 2016

(65) Prior Publication Data

US 2016/0274172 A1 Sep. 22, 2016

(30) Foreign Application Priority Data

Mar. 20, 2015 (JP) .................................. 2015-058513

(51) Int. Cl.
| | |
|---|---|
| *H02P 7/00* | (2016.01) |
| *G01R 31/02* | (2006.01) |
| *H02M 1/32* | (2007.01) |
| *H02P 27/06* | (2006.01) |
| *H02M 5/458* | (2006.01) |
| *H02M 7/5387* | (2007.01) |
| *H02M 1/00* | (2006.01) |

(52) U.S. Cl.
CPC ............ *G01R 31/028* (2013.01); *H02M 1/32* (2013.01); *H02M 5/458* (2013.01); *H02M 7/5387* (2013.01); *H02M 2001/008* (2013.01); *H02P 27/06* (2013.01)

(58) Field of Classification Search
CPC ......... G01R 31/028; H02P 6/10; H02P 27/06; H02P 29/02; H02P 1/022
USPC ...................................................... 318/490
See application file for complete search history.

(56) References Cited

FOREIGN PATENT DOCUMENTS

JP 2000152643 A 5/2000

OTHER PUBLICATIONS

English Abstract for Japanese Publication No. 2000-152643 A, published May 30, 2000, 2 pgs.

*Primary Examiner* — Eduardo Colon Santana
*Assistant Examiner* — Gabriel Agared
(74) *Attorney, Agent, or Firm* — Fredrikson & Byron P.A.

(57) ABSTRACT

A motor driving apparatus includes: a voltage detecting unit for detecting a voltage of each direct-current capacitor; a current detecting unit for detecting each current inputted to or outputted from each inverter; an commanding unit for outputting a power-converting command to each inverter after each direct-current capacitor is charged and supply of direct-current power to a converter is shut off; a current integrating unit for integrating each current detected while the power-converting command is outputted; a capacity estimating unit for calculating the estimated capacity of each direct-current capacitor based on the current integration value and the voltage of the direct-current capacitor after supply of direct-current power to the converter is shut off and before the power-converting command is outputted; and a life determining unit for determining a life of each direct-current capacitor based on the initial capacity value and the estimated capacity of the direct-current capacitor.

7 Claims, 5 Drawing Sheets

MOTOR DRIVING APPARATUS INCLUDING LIFE DETERMINING UNIT OF DIRECT-CURRENT CAPACITOR

BACKGROUND OF THE INVENTION

1. Field of the Invention

The present invention relates to a motor driving apparatus that converts an alternating-current power supplied from the three-phase alternating current input into a direct-current power and outputs the same to the direct-current link, and thereafter further converts the same into an alternating-current power for driving the motor and supplies the same to the motor. In particular, the present invention relates to a motor driving apparatus including a life determining unit for determining the life of a direct-current capacitor provided in the direct-current link.

2. Description of the Related Art

In a motor driving apparatus for driving a motor in machine tools, industrial machines, forging machines, injection molding machines, or various types of robots, an alternating-current power inputted from the alternating-current power source is first converted into a direct-current power by means of a converter, and then the resulting direct-current power is converted into an alternating-current power by means of an inverter, and the resulting alternating-current power is used as a driving power of the motor.

FIG. 4 is a diagram depicting a configuration of a general motor driving apparatus. The motor driving apparatus 100 includes a converter 101 converting an alternating-current power from a commercial three-phase alternating-current power source (hereinafter simply "alternating-current power source") 103 into a direct-current power, and an inverter 102 converting a direct-current power outputted from the converter 101 into an alternating-current power of a desired frequency to be supplied as a driving power of the motor 104 or converting an alternating-current power regenerated by the motor 104 into a direct-current power, and controls the speed, torque of the motor 104 connected to the alternating-current side of the inverter 102, or the position of the rotor. The converter 101 is connected to the inverter 102 via a direct-current link (DC link). A direct-current capacitor (DC link capacitor) 105 is provided in the direct-current link, for smoothing the direct-current output of the converter 101.

Generally speaking, when there are a plurality of driving shafts (feed shaft and main shaft), a plurality of motors are provided, too, for driving each driving shaft. The inverters are provided in the same number as the number of motors and are connected in parallel, for driving and controlling the motors by supplying a driving power to motors individually, which are provided for the plurality of driving shafts, respectively. Direct-current capacitors are provided at the direct-current input side of inverters, respectively. On the contrary, a single converter is often provided for a plurality of inverters, for reducing the cost and the occupied space of the motor driving apparatus. Note that for simplifying the drawing, FIG. 4 depicts a single motor 104, and therefore the number of inverters 102 is one.

The direct-current capacitor provided in the direct-current link between the converter and the inverter is generally known as a component having a limited life whose electrostatic capacity (hereinafter simply "capacity") decreases by repetition of charge and discharge. When the capacity of the direct-current capacitor decreases, the ripple current running through the direct-current link increases, to increase the fluctuation in direct-current voltage increases, which is problematic. The direct-current capacitor determined to have ended its life needs to be exchanged. In view of the above, it is important to determine whether the life of a direct-current capacitor is ended or not by accurately grasping the capacity of the direct-current capacitor.

For example, as described in Japanese Unexamined Patent Publication No. 2000-152643, an instrument is known that determines a life of a direct-current capacitor using a time integration value of a charge current of the direct-current capacitor at the initial charge and the voltage value of the direct-current capacitor.

FIG. 5 depicts an overview explaining the invention described in Japanese Unexamined Patent Publication No. 2000-152643. In this explanation, an example in which a plurality of motors are provided to drive n driving shafts (n is a natural number equal to or greater than 2) is taken. N inverters are provided to supply a driving power to n motors, and n direct-current capacitors are respectively provided for n inverters. By representing each set made up of a motor, an inverter connected to this motor and a direct-current capacitor connected to this inverter as instruments 120-1, 120-2, ..., 120-n, n instruments 120-1, 120-2, ..., 120-n are connected in parallel as depicted in FIG. 5. Note that so as to simplify the drawing, FIG. 5 does not depict motors and inverters for the instruments 120-1, 120-2, ..., 120-n, and only depicts direct-current capacitors 105-1, 105-2, ..., 105-n. In the invention described in Japanese Unexamined Patent Publication No. 2000-152643, so as to determine the life of the direct-current capacitor, a switch SW1, a charging resistance 107, a direct-current-capacitor charge-control circuit 115 are provided to perform initial charge of the direct-current capacitor with a current I obtained by converting the alternating current from the alternating-current power source 103 into a direct current by means of a converter 101. Then, the charge current I detected in the initial charge period of the direct-current capacitors 105 is time integrated by a charge-current integrating circuit 116, and the direct-current-capacitor-capacity estimating circuit 117 calculates an estimated capacity of the direct-current capacitor from the obtained current integration value and the voltage V of the direct-current capacitor. Assuming the capacities of the direct-current capacitors 105-1, 105-2, ..., 105-n as $C_1, C_2, ..., C_n$, Equation 1 holds true.

$$C_1 + C_2 + ... + C_n = \frac{\int I dt}{V} \quad (1)$$

When the capacity of the direct-current capacitor provided in the direct-current link between the converter and the inverter in the motor driving apparatus decreases by repetition of charge and discharge as described above, the ripple current running through the direct-current link increases, to increase the fluctuation in direct-current voltage, which is problematic. Therefore, it is important to accurately measure the capacity of the direct-current capacitor. Unless the capacity of the direct-current capacitor can be measured accurately, the timing of exchanging the direct-current capacitor may be missed, which has a possibility of causing a large ripple current in the direct-current link or a fluctuation in direct-current voltage, or of exchanging a direct-current capacitor still alive too early. Therefore, it is important to determine whether the life of a direct-current capacitor is ended by accurately grasping the capacity of the direct-current capacitor.

As described above, when there are a plurality of driving shafts to be driven by the motor driving apparatus, a plurality of sets, each of which is made up of a motor, an inverter, and a direct-current capacitor, are provided to respectively correspond to the plurality of driving shafts. In such cases, when attempting to determine the life of a direct-current capacitor based on the invention described in Japanese Unexamined Patent Publication No. 2000-152643, what can be estimated by using the time integration value of a charge current of the direct-current capacitor at the initial charge and the voltage value of the direct-current capacitor and based on Equation 1 is a combined capacity "$C_1 + C_2 + \ldots + C_n$" of the plurality of direct-current capacitors, but the capacity of each direct-current capacitor cannot be estimated. In other words, a direct-current capacitor having ended its life cannot be identified from a plurality of direct-current capacitors, which is not convenient.

SUMMARY OF THE INVENTION

In light of the above-described problems, an objective of the present invention is to provide a motor driving apparatus that can accurately determine the life of each of a plurality of direct-current capacitors corrected in parallel in a direct-current link between a converter and inverters.

So as to achieve the above-described objective, a motor driving apparatus including a plurality of direct-current capacitors in a direct-current link includes: a voltage detecting unit for detecting a voltage of each direct-current capacitor; a current detecting unit for detecting each current inputted to or outputted from each inverter; a commanding unit for outputting a power-converting command to each inverter after each direct-current capacitor is charged and supply of direct-current power to a converter is shut off; a current integrating unit for integrating each current detected while the power-converting command is outputted; a capacity estimating unit for calculating the estimated capacity of each direct-current capacitor based on the current integration value corresponding to the direct-current capacitor and the voltage of the direct-current capacitor after supply of direct-current power to the converter is shut off and before the power-converting command is outputted; and a life determining unit for determining a life of each direct-current capacitor based on the initial capacity value and the estimated capacity of the direct-current capacitor.

The life determining unit may determine that the direct-current capacitor ended its life, when a ratio of the estimated capacity to the initial capacity is equal to or smaller than a pre-set standard ratio.

The life determining unit may determine that the direct-current capacitor ended its life, when the estimated capacity is equal to or smaller than a value obtained by multiplying the initial capacity by a pre-set standard ratio.

The current detecting unit may detect a current outputted from the inverters, for each of the inverters, and the power-converting commands outputted from the commanding unit may command conversion of a direct-current power in the direct-current link to a reactive power.

The motor driving apparatus may further include a standard-ratio setting unit for setting the standard ratio.

The motor driving apparatus may further include an alarm signal outputting unit for outputting an alarm signal when the life determining unit has determined that the direct-current capacitor ended its life.

The motor driving apparatus may further include an initial capacity storage unit having stored therein an initial capacity value of the direct-current capacitor still unused measured in advance.

BRIEF DESCRIPTION OF THE DRAWINGS

The present invention will be clearly understood with reference to the attached drawings.

DETAILED DESCRIPTION

The motor driving apparatus including a life determining unit of a direct-current capacitor will be described below with reference to the drawings. However, it is noted that the present invention is not limited by the drawings and the embodiment described below.

The number of direct-current capacitors to be provided in a motor driving apparatus according to the present invention is at least two in the direct-current link. In the exemplary embodiment explained below, a case in which two motors are driven by a motor driving apparatus is explained as one example. The type of motors driven by the motor driving apparatus are not particularly limit the present invention, and may be an induction motor or a synchronous motor, for example.

Figure 1:
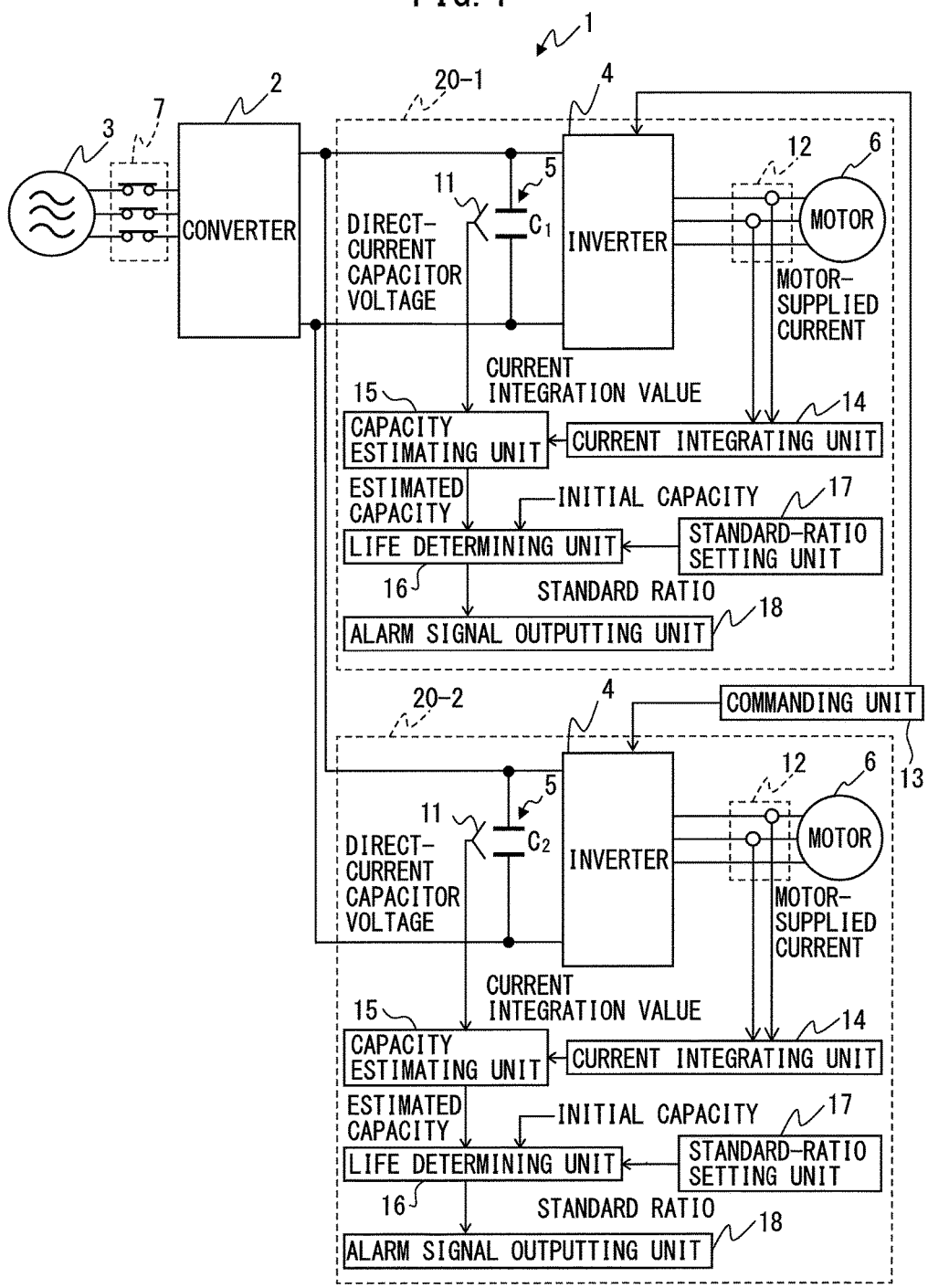
FIG. 1 is a principle block diagram depicting a motor driving apparatus according to a first embodiment example.

First, a circuitry configuration of a motor driving apparatus according to the first embodiment example is explained. FIG. 1 is a principle block diagram depicting a motor driving apparatus according to a first embodiment example. Hereafter, those assigned the same reference numeral in different drawings indicate the constituting element having the same function. The motor driving apparatus 1 according to the first embodiment example includes a converter 2, a direct-current capacitor 5, inverters 4, a voltage detecting unit 11, a current detecting unit 12, a commanding unit 13, a current integrating unit 14, a capacity estimating unit 15, a life determining unit 16, and a standard-ratio setting unit 17. An alternating-current power source 3 is connected to the alternating-current-input-side of the converter 2 in the motor driving apparatus 1, and motors 6 are connected to the alternating-current-output-side of the inverters 4 in the motor driving apparatus 1. The inverters 4 are connected in parallel in the same number as the number of the motors 6 provided to respectively correspond to a plurality of driving shafts (not depicted in the drawings), so as to individually supply a driving power to each motor 6. Direct-current capacitors 5 are respectively provided in the direct-current-input-side of the inverters 4. Consequently, each motor 6 is provided with a direct-current capacitor 5, an inverter 4, a voltage detecting unit 11, a current detecting unit 12, a current integrating unit 14, a capacity estimating unit 15, a life determining unit 16, and a standard-ratio setting unit 17. As follows, these constituting elements provided for each one motor 6 are collectively referred to as the first instrument 20-1 and the second instrument 20-2. In other words, the first instrument 20-1 and the second instrument 20-2 are connected in parallel. One converter 2 is provided for a plurality of inverters 4, for reducing the cost and the occupied space of the motor driving apparatus. The converter 2 rectifies the alternating-current power supplied from the alternating-current-input-side on which the commercial three-phase alternating-current power source 3 is, and outputs a direct-current power to the direct-current link being the direct-current-output-side of the converter 2. The present invention is not particularly limited to any exemplary embodiment of the converter 2 adopted; for example, the converter 2 may be a three-phase, full-wave diode rectifying circuit having 120 -degree conducting and regenerating functions, a PWM control rectifying circuit, and so on. Note that an electromagnetic contactor 7 is connected to the alternating-current-input-side of the converter 2.

The converter 2 and the inverters 4 are connected via the direct-current link. The inverters 4 mutually exchange an alternating-current power being a driving power or a regenerative power of the motor 6, with the direct-current power in the direct-current link. As depicted in FIG. 1, the inverter 4 provided in the first instrument 20-1 and the inverter 4 provided in the second instrument 20-2 are connected in parallel. The inverter 4 is constituted as a converting circuit including a switching element therein, such as a PWM inverter, for example. When the motor is driven normally, the inverters 4 converts the direct-current power supplied from the direct-current link side to a three-phase alternating-current power of a desired voltage and a desired frequency for driving the motor 6, by switching-operating the switching element inside, based on a motor-driving command received from a higher-level numerical-value control apparatus (not depicted in the drawing). Accordingly, the motor 6 will be operated based on the supplied three-phase alternating-current power of which the voltage is variable the frequency is variable. When the motor 6 is damped, although a regenerative power is generated, the alternating-current power being a regenerative power generated in the motor 6 is converted into a direct-current power and returned to the direct-current link, based on the motor-driving command received from the higher-level control apparatus.

When having received a power-converting command from a later-described commanding unit 13, the inverters 4 switching-operates the internal switching element based on the power-converting command, and converts the direct-current power in the direct-current link into an alternating-current power and outputs the result.

The direct-current capacitor 5 is provided in the direct-current link that connects the direct-current-output-side of the converter 2 to the direct-current-input-side of the inverters 4. The direct-current capacitor 5 includes a function of temporarily accumulating the direct-current power outputted from either the converter 2 or the inverters 4, in addition to a function of restraining the pulsation component of the direct-current output of the converter 2 or the inverters 4. As depicted in FIG. 1, the direct-current capacitor 5 provided in the first instrument 20-1 and the direct-current capacitor 5 provided in the second instrument 20-2 are connected in parallel. The direct-current capacitor 5 is initially charged with the direct-current power outputted from the converter 2.

The voltage detecting unit 11 detects a voltage applied to the direct-current capacitor. As described above, each of the first instrument 20-1 and the second instrument 20-2 is provided with a direct-current capacitor 5, and therefore each of the first instrument 20-1 and the second instrument 20-2 is also provided with a voltage detecting unit 11, so as to detect the voltage applied to the direct-current capacitors 5.

In the present exemplary embodiment, the current detecting unit 12 detects the current outputted from the inverters 4. As described above, each of the first instrument 20-1 and the second instrument 20-2 is provided with an inverter 4, and therefore each of the first instrument 20-1 and the second instrument 20-2 is also provided with a current detecting unit 12, so as to detect the current outputted from the inverters 4. Note that the current detecting unit 12 may be provided between the direct-current capacitor 5 and the inverters 4 so as to detect the current inputted to the inverters 4, and this is explained in the second embodiment example described later.

After each direct-current capacitor 5 in the first instrument 20-1 and the second instrument 20-2 is charged and the supply of direct-current power from the alternating-current power source 3 to the converter 2 is shut off by the electromagnetic contactor 7, the commanding unit 13 simultaneously outputs power-converting commands to the inverters 4 in the first instrument 20-1 and the second instrument 20-2 to command conversion of the direct-current power in the direct-current link 5 to an alternating-current power. By simultaneously providing the power-converting commands to the inverters 4, movement of charge between the direct-current capacitors 5 within the first instrument 20-1 and the second instrument 20-2 can be prevented. Note that the command unit 13 may for example be realized as one function in the numerical-value control apparatus described above (not depicted in the drawings), or may be constituted by a separate computer independent from such a numerical-value control apparatus. In addition, the power-converting command outputted by the commanding unit 13 to the inverters 4 may be a command to convert the direct-current power in the direct-current link to a reactive power.

The current integrating unit 14 integrates the current outputted from the inverters 4 and detected by the current detecting unit 12 while the commanding unit 13 is outputting the power-converting commands, and outputs the result as a current integration value concerning the converter 4. As described above, each of the first instrument 20-1 and the second instrument 20-2 is provided with an inverter 4 and a current detecting unit 12 detecting this outputted current, and therefore each of the first instrument 20-1 and the second instrument 20-2 is also provided with a current integrating unit 14 so as to integrate the current outputted from the inverters 4 and detected by the current detecting unit 12. Thus, the current integrating unit 14 outputs current integration values respectively for the converters 4 in the first instrument 20-1 and the second instrument 20-2.

The capacity estimating unit 15 calculates an estimated capacity of the direct-current capacitor 5 based on the current integration value outputted from the current integrating unit 14 and the voltage of the direct current capacitor 5 detected by the voltage detecting unit 11 after the supply of the direct-current power to the converter 2 is shut off and before the power-converting commands are outputted by the commanding unit 13. As described above, each of the first instrument 20-1 and the second instrument 20-2 is provided with a current integrating unit 14 and a voltage detecting unit 11, and therefore each of the first instrument 20-1 and the second instrument 20-2 is also provided with a capacity estimating unit 15, so as to calculate the estimated capacity of the direct-current capacitor 4 based on the current integration value outputted from the current integrating unit 14 and the voltage of the direct-current capacitor 5 detected by the voltage detecting unit 11. Therefore, the capacity estimating unit 15 outputs estimated capacity of the direct-current capacitor 5 in each of the first instrument 20-1 and the second instrument 20-2. A specific calculation method of the estimated capacities of the direct-current capacitors 5 by the capacity estimating unit 15 is described later.

The life determining unit 16 determines whether the direct-current capacitor 5 ended its life based on the initial capacity value of the direct-current capacitor 5 still unused measured in advance and the estimated capacity of the direct-current capacitor 5 calculated by the capacity estimating unit 15. As described above, each of the first instrument 20-1 and the second instrument 20-2 is provided with a capacity estimating unit 15 thereby calculating the estimated capacity for each direct-current capacitor 5, and therefore each of the first instrument 20-1 and the second instrument 20-2 is also provided with a life determining unit 16, so as to determine the life of each direct-current capacitor 5 in the first instrument 20-1 and the second instrument 20-2. Therefore, for each direct-current capacitor 5 in the first instrument 20-1 and the second instrument 20-2, the life determining unit 16 determines whether the direct-current capacitor 5 ended its life based on the initial capacity value of the direct-current capacitor 5 still unused measured in advance and its estimated capacity. Note that although not depicted in the drawings, an initial capacity storage unit may further be provided in which the initial capacity value of a direct-current capacitor 5 still unused measured in advance is stored. For example, it may be stored collectively in an EEPROM. A specific method of determining a life of the direct-current capacitor 5 by the life determining unit 16 is described later.

The standard-ratio setting unit 17 sets a standard ratio used in life determining processing by the life determining unit 16. As described above, each of the first instrument 20-1 and the second instrument 20-2 is provided with a life determining unit 16 thereby determining the life for each direct-current capacitor 5, and therefore each of the first instrument 20-1 and the second instrument 20-2 is also provided with a standard-ratio setting unit 17. The standard-ratio setting unit 17 includes a user interface function such as a personal computer, a keyboard, a touch panel, a mouse, which enables a user to freely rewrite the standard ratio from outside. Alternatively, the standard-ratio setting unit 17 may be configured by a mechanical volume for changing the variable resistor and its resistance value. The standard ratio set by the standard-ratio setting unit 17 is stored in a storage unit (not depicted in the drawings). The standard ratio is used in life determining processing by being read by the life determining unit 16 from the storage unit.

The alarm signal outputting unit 18 outputs an alarm signal when the life determining unit determines that the direct-current capacitor 5 has ended its life (i.e., reached the end of its life). As described above, each of the first instrument 20-1 and the second instrument 20-2 is provided with a life determining unit 16 thereby determining the life for each direct-current capacitor 5, and therefore each of the first instrument 20-1 and the second instrument 20-2 is also provided with an alarm signal outputting unit 18.

Figure 2:
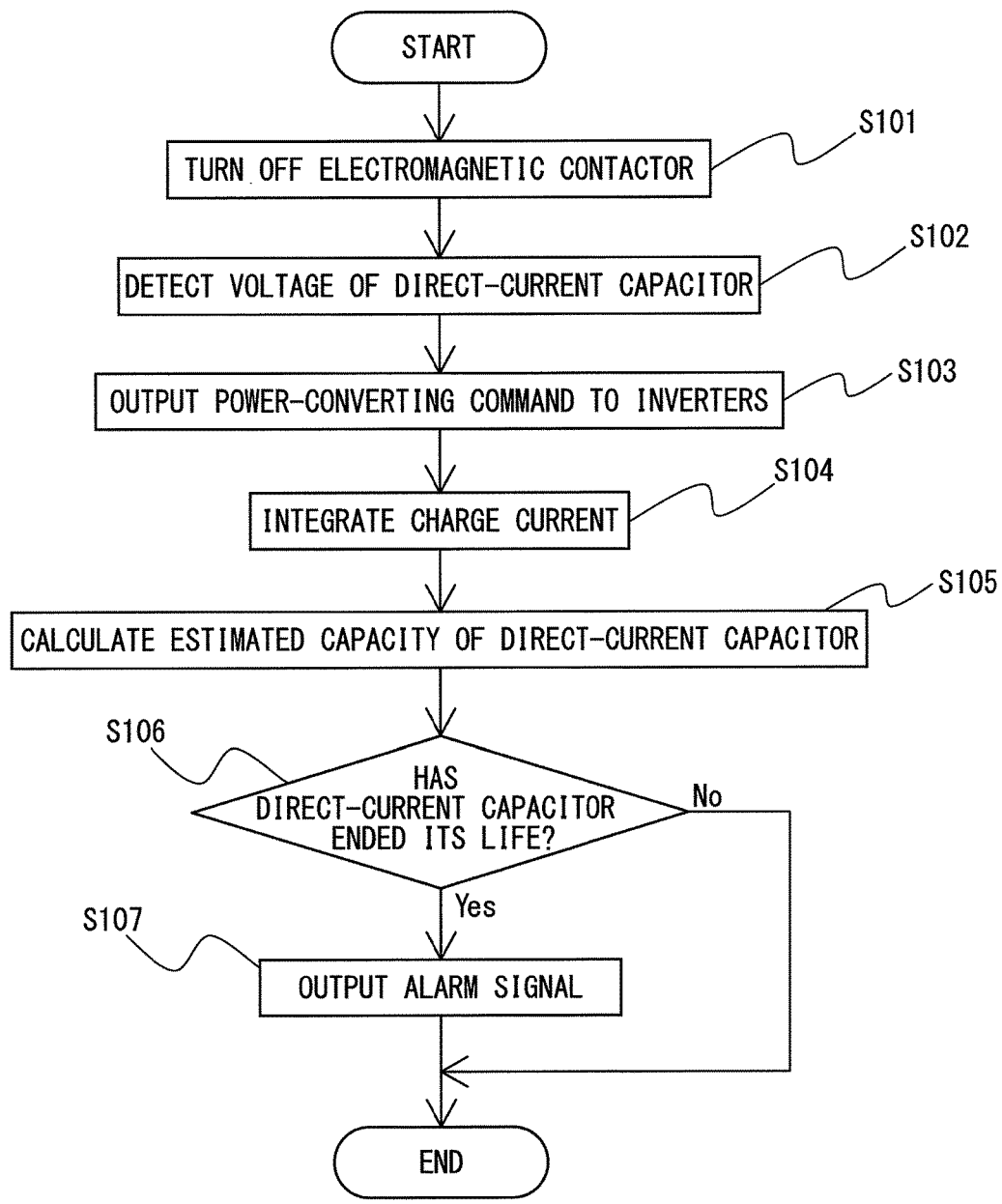
FIG. 2 is a flowchart depicting life determining processing by the motor driving apparatus according to the first embodiment example.

Next, the operation of life determining processing by the motor driving apparatus 1 in the first embodiment example is explained. FIG. 2 is a flowchart depicting life determining processing by the motor driving apparatus according to the first embodiment example.

Prior to performing the life determining processing, the electromagnetic contactor 7 is turned ON, to take an alternating-current power into the converter 2 from the alternating-current power source 3, and this alternating-current power is converted into a direct-current power by means of the converter 2, and each direct-current capacitor 5 in the first instrument 20-1 and the second instrument 20-2 is charged in advance with this direct-current power. Then, in Step 5101, the electromagnetic contactor 7 is turned OFF. By turning OFF the electromagnetic contactor 7, the supply of direct-current power from the alternating-current power source 3 to the converter 2 is shut off, and the state in which a charge is accumulated in each direct-current capacitor 5 is maintained.

Next, in Step 5102, the voltage detecting unit 11 in the first instrument 20-1 and the second instrument 20-2 is respectively used to detect the voltage of each direct-current capacitor 5. Thus detected voltage of the direct-current capacitor 5 is the voltage in the state in which the charge is accumulated in each direct-current capacitor 5 after the supply of direct-current power to the converter 2 is shut off in Step 5101 and before the power-converting commands are outputted by the commanding unit 13 in the next Step S 103.

In Step S103, the commanding unit 13 simultaneously outputs power-converting commands to the inverters 4 in the first instrument 20-1 and the second instrument 20-2 to command conversion of the direct-current power in the direct-current link 5 to an alternating-current power. By the commanding unit 13 simultaneously outputting the power-converting commands to the inverters 4, movement of charge between the direct-current capacitors 5 within the first instrument 20-1 and the second instrument 20-2 can be prevented, which improves the accuracy of life determination of the direct-current capacitor 5 detailed later. While the power-converting commands are outputted by the commanding unit 13, each inverter 4 converts a direct-current power in the direct-current link 5 into an alternating-current power according to the received power-converting command and outputs the result. Accordingly, in each of the first instrument 20-1 and the second instrument 20-2, a current is supplied from the inverter 4 to the motor 6, and the supplied current is consumed by the motor 6. In other words, by outputting power-converting commands simultaneously to the inverters 4, the energy discharged by the direct-current capacitors 5 is supplied via the inverters 4 to the motors 6, and consumed by a rotating operation of the motors 6. Note that when the power-converting command outputted by the commanding unit 13 to the inverter 4 is set to be "a command to convert the direct-current power in the direct-current link to a reactive power," by that conversion command to reactive power, each inverter 4 can convert the direct-current power in the direct-current link to a reactive power, and supply the same to the motor 6, and this reactive power causes the motor 6 to consume energy without rotation.

Note that while the power-converting commands are outputted by the commanding unit 13, each current detecting unit 12 in the first instrument 20-1 and the second instrument 20-2 respectively detects the current outputted by each inverter 4. The detected current value is transmitted to each current integrating unit 14.

In Step S104, the current integrating unit 14 in the first instrument 20-1 and the second instrument 20-2 integrates the current outputted from the inverters 4 and detected by a corresponding current detecting unit 12, and outputs the result as the current integration value of concerning the converter 4.

After sufficient time for the direct-current capacitor 5 to complete discharge has passed, in Step S105, the capacity estimating unit 15 calculates the estimated capacity of the direct-current capacitor 5 based on the current integration value outputted from the current integrating unit 14 and the voltage of the direct-current capacitor 5 detected by the voltage detecting unit 11 after the supply of the direct-current power to the converter 2 is shut off and before the power-converting command is outputted from the commanding unit 13

Taking into consideration that the energy discharged by the direct-current capacitor 5 is consumed by the motor 6, the estimated capacity of the direct-current capacitor 5 is calculated by the capacity estimating unit 15 as follows.

Assume that, for the first instrument 20-1, the current outputted from the inverter 4 and detected by the current detecting unit 12 during the period in which the power-converting command is outputted by the commanding unit 13 is set to be $I_1$, and the voltage of the direct-current capacitor 5 detected by the voltage detecting unit 11 after the supply of direct-current power to the converter 2 is shut off and before the power-converting command is outputted by the commanding unit 13 is set to be $V_1$. Then, the estimated capacity $C_1$ of the direct-current capacitor 5 can be expressed by Equation 2. The period for integration of the outputted current $I_1$ from the inverter 4 is a period from the output-start time (i.e., the discharge-start time of the direct-current capacitor 5) of the power-converting command by the commanding unit 13 to the time at which a sufficient time for the direct-current capacitor 5 to complete discharge has passed.

$$C_1 = \frac{\int I_1 dt}{V_1} \quad (2)$$

Likewise, assume that, for the second instrument 20-2, the current outputted from the inverter 4 and detected by the current detecting unit 12 during the period in which the power-converting command is outputted by the commanding unit 13 is set to be $I_2$, and the voltage of the direct-current capacitor 5 detected by the voltage detecting unit 11 after the supply of direct-current power to the converter 2 is shut off and before the power-converting command is outputted by the commanding unit 13 is set to be $V_2$. Then, the estimated capacity $C_2$ of the direct-current capacitor 5 can be expressed by Equation 3. The period for integration of the outputted current $I_2$ from the inverter 4 is a period from the output-start time (i.e., the discharge-start time of the direct-current capacitor 5) of the power-converting command by the commanding unit 13 to the time at which a sufficient time for completing the discharge of the direct-current capacitor 5 has passed.

$$C_2 = \frac{\int I_2 dt}{V_2} \quad (3)$$

By simultaneously providing power-converting commands to the inverters 4, energy discharged by each direct-current capacitor 5 is supplied to the corresponding motor 6. Under this condition, Equation 4 holds true.

$$V_1 \neq V_2 \quad (4)$$

Accordingly, in the present embodiment example, the capacity estimating unit 15 in the first instrument 20-1 calculates the estimated capacity $C_1$ of the direct-current capacitor 5 based on Equation 2 from the current integration value of the outputted current $I_1$ from the inverter 4 and the voltage $V_1$ of the direct-current capacitor 5 detected by the voltage detecting unit 11 after the supply of direct-current power to the converter 2 is shut off and before the power-converting command is outputted by the commanding unit 13. The capacity estimating unit 15 in the second instrument 20-2 calculates the estimated capacity $C_2$ of the direct-current capacitor 5 based on Equation 3 from the current integration value of the outputted current $I_2$ from the inverter 4 and the voltage $V_2$ of the direct-current capacitor 5 detected by the voltage detecting unit 11 after the supply of direct-current power to the converter 2 is shut off and before the power-converting command is outputted by the commanding unit 13.

Note that the result of calculation by the capacity estimating unit 15 for example may be displayed on a display (not depicted in the drawings) or stored in a storage unit (not depicted in the drawings). By doing so, an operator can know the estimated capacity of each direct-current capacitor 5.

With reference to FIG. 2 again, in Step S106, the life determining unit 16 in the first instrument 20-1 determines whether the direct-current capacitor 5 in the first instrument 20-1 ended its life based on the initial capacity value $C_{01}$ of the direct-current capacitor 5 still unused measured in advance and the estimated capacity $C_1$ calculated by the capacity estimating unit 15. In addition, the life determining unit 16 in the second instrument 20-2 determines whether the direct-current capacitor 5 in the second instrument 20-2 ended its life is determined based on the initial capacity value $C_{02}$ of the direct-current capacitor 5 still unused measured in advance and the estimated capacity $C_2$ calculated by the capacity estimating unit 15. For an instrument whose direct-current capacitor 5 is determined to have ended its life (i.e., reached the end of its life), the processing in Step S107 described later is executed.

The following explains a method of determining the life of the direct-current capacitor 5 by the life determining unit 16. Since the following method is applicable to any of the direct-current capacitors 5 in the first instrument 20-1 and the second instrument 20-2, the direct-current capacitor 5 in the first instrument 20-1 is taken as a representative example in the explanation.

Generally speaking, the capacity of the direct-current capacitor 5 decreases by repetition of charge and discharge thereof, and therefore in the present embodiment example, "$C_0/C_1$" being the ratio of the estimated capacity $C_1$ to the initial capacity $C_{01}$ of the direct-current capacitor 5 is used a material in the determination as to whether the direct-current capacitor 5 ended its life. Specifically, the following two methods can be contemplated. In the first method, the life determining unit 16 determines that the direct-current capacitor ended its life (i.e., reached the end of its life) when the ratio "$C_{01}/C_1$" of the estimated capacity $C_1$ to the initial capacity $C_{01}$ is equal to or smaller than the pre-set standard ratio set in advance by the standard-ratio setting unit 17. In the second method, when the estimated capacity $C_1$ is equal to or smaller than the value obtained by multiplying the initial capacity $C_{01}$ by the pre-set standard ratio, the life determining unit 16 determines that the direct-current capacitor ended its life (i.e., reached the end of its life). The first method is substantially the same as the second method, i.e., the first method compares the capacity ratios of the direct-current capacitor, and the second method compares the capacities of the direct-current capacitor themselves.

With reference to FIG. 2 again, in Step S107, the alarm signal outputting unit 18 outputs an alarm signal indicating that the direct-current capacitor 5 ended its life (i.e., reached the end of its life). The processing of Step S107 is performed for instrument(s) whose direct-current capacitor 5 was determined to have ended its life (i.e., reached the end of its life) in Step S106.

Alarm signals outputted from the alarm signal outputting unit 18 can be made use of as follows. For example, in a system in which a converter is connected to an inverter via a direct-current link provided with a direct-current capacitor, it is possible to stop the operation of the whole system when the main controller, performing integrated control of the operation of the system, receives such an alarm signal from the alarm signal outputting unit 18. It is also possible to make a sound for reporting to a user when an alarm signal is received, by means of a speaker or a buzzer making a sound. In addition, it is possible to indicate that the direct-current capacitor ended its life by means of text or picture images on a display of a personal computer or a mobile terminal, when such instruments received an alarm signal for example. Furthermore, it is also possible to make a storage unit memorize the date and time on which an alarm signal is issued, for use in later maintenance operations. In either cases, because an alarm signal is issued for instrument(s) whose direct-current capacitor 5 was determined to have ended its life (i.e., reached the end of its life) in Step S106, a user can clearly understand which of the first instrument 20-1 and the second instrument 20-2 has a direct-current capacitor whose capacity is lowered and needs exchange, which reduces the burden on the user.

The standard ratio can be freely set by a user using the standard-ratio setting unit 17. For example, a plurality of standard ratios, as well as a plurality of alarm signals corresponding to the standard ratios, may be provided, and the result of life determination may be classified into a plurality of levels such as "warning level," "alarm level," and so on, for example.

In addition, in the present embodiment example, power-converting commands are simultaneously provided to the inverters 4, thereby preventing movement of a charge between the direct-current capacitors 5 in the first instrument 20-1 and the second instrument 20-2, so as to improve the accuracy in life determination of the direct-current capacitors 5. It is also possible to, in addition to this procedure, provide an inductance between the first instrument 20-1 and the second instrument 20-2 so as to avoid interference between the direct-current capacitors 5 in the first instrument 20-1 and the second instrument 20-2, which can further improve the accuracy in life determination of the direct-current capacitors 5.

Figure 3:
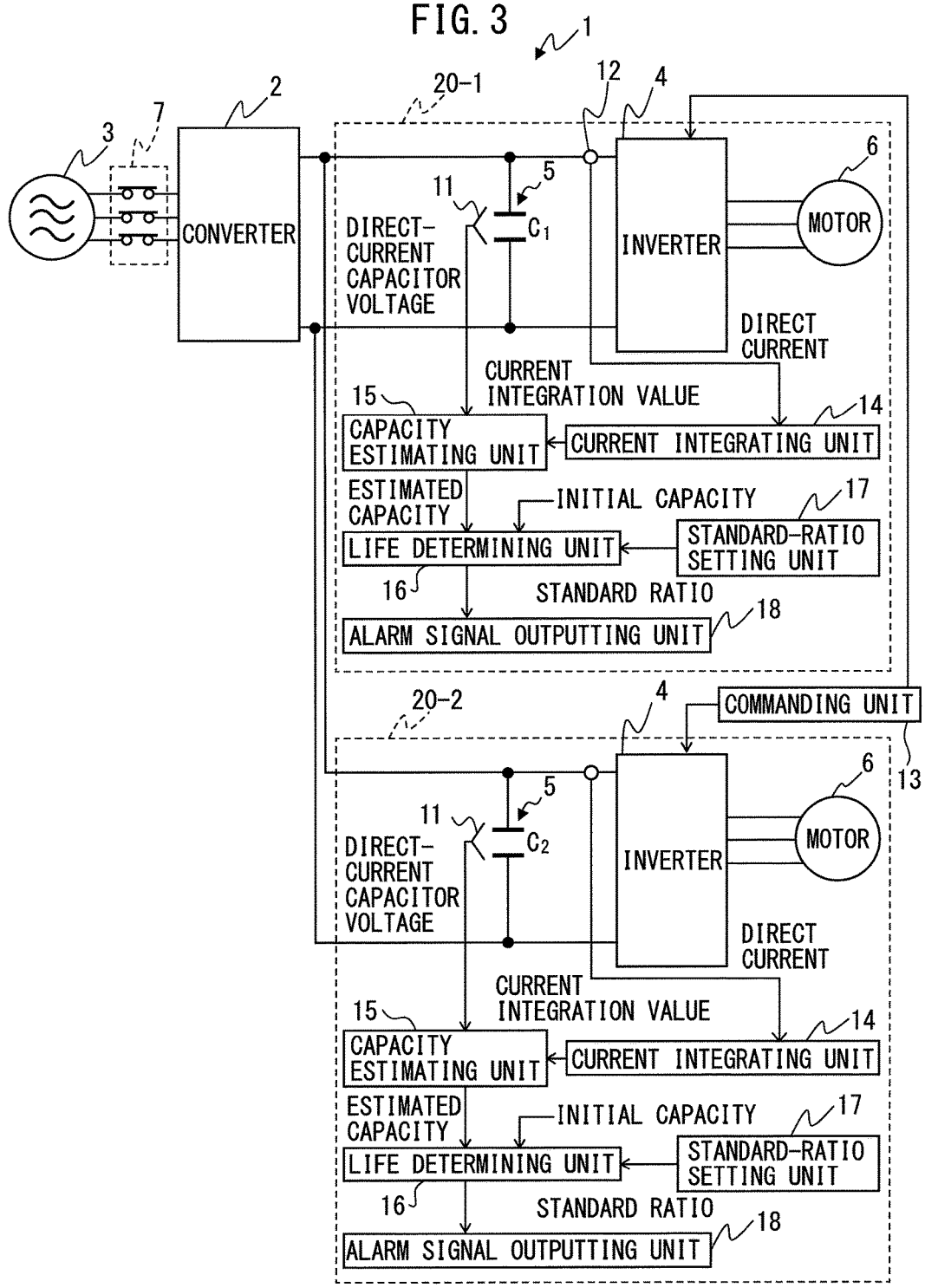
FIG. 3 is a principle block diagram depicting a motor driving apparatus according to a second embodiment example.
Figure 4:
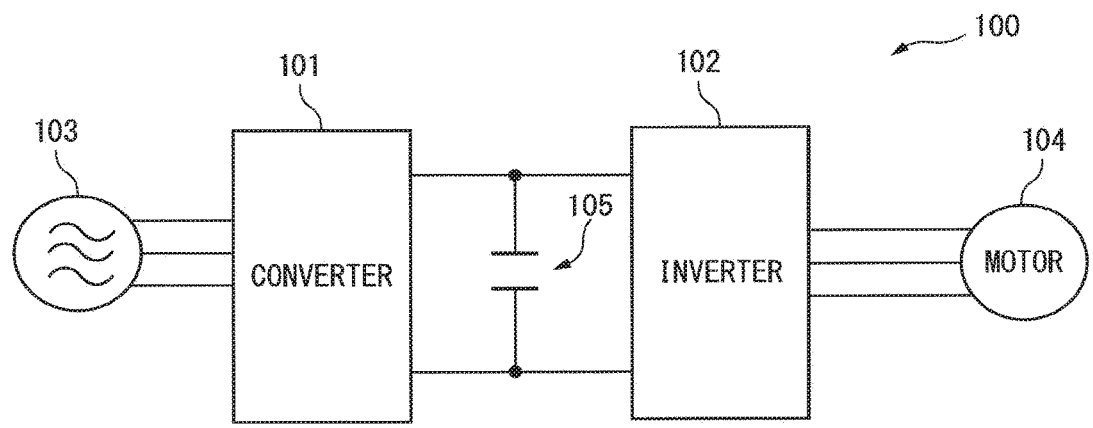
FIG. 4 is a diagram depicting a configuration of a common motor driving apparatus.
Figure 5:
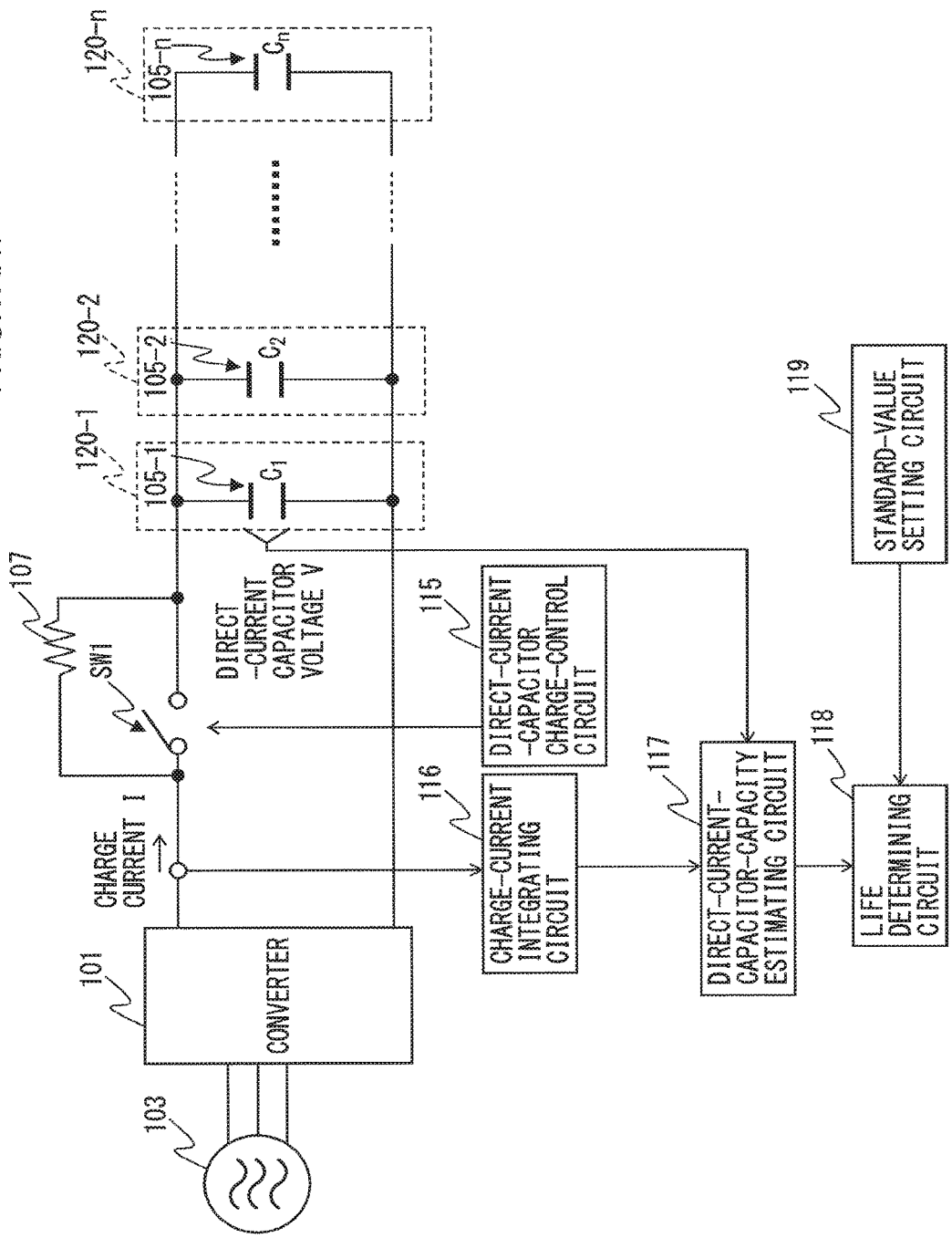
FIG. 5 is a schematic diagram explaining the invention described in Japanese Unexamined Patent Publication No. 2000-152643.

Next, the second embodiment example is described. FIG. 3 is a principle block diagram depicting a motor driving apparatus according to the second embodiment example. In the above-described first embodiment example, the current detecting unit 12 detects the current outputted from the inverter 4, whereas in the second embodiment example, current detecting unit 12 is provided between the direct-current capacitor 5 and the inverter 4, so as to detect the current inputted to the inverter 4.

In the present embodiment example, the current detecting unit 12 detects the current inputted to the inverter 4. As described above, each of the first instrument 20-1 and the second instrument 20-2 is provided with an inverter 4, and therefore each of the first instrument 20-1 and the second instrument 20-2 is also provided with a current detecting unit 12, between the direct-current capacitor 5 and the inverter 4, so as to detect the current inputted to the inverter 4. Accordingly, the current integrating unit 14 in the first instrument 20-1 and the second instrument 20-2, while the commanding unit 13 is outputting the power-converting commands, integrates the current inputted in the inverter 4 and detected by the current detecting unit 12, and outputs the result to the corresponding capacity estimating unit 15 as the current integration value of the converter 4. In the first embodiment example in which an alternating current is detected, the current detecting unit 12 has to be constituted by two sensors so as to detect two phases of current in the three-phase alternating current in each instrument. However, in the second embodiment example, what is detected is a direct current, and therefore only one sensor is necessary to constitute the current detecting unit 12 in each instrument. Therefore, the number of components can be reduced compared to the first embodiment example.

Note that the other circuitry constituting elements other than described above concerning the second embodiment example are the same as the circuitry constituting elements depicted in FIG. 1, and therefore the same reference numeral is assigned to the same constituting element, and its detailed description is omitted for the circuitry constituting element. In addition, with respect to the operating principle of the life determining processing in the motor driving apparatus 1 according to the second embodiment example, those explained with respect to the first embodiment example with reference to FIG. 2 can be similarly used.

As described above, the first and second embodiment examples have a two-parallel system of the direct-current capacitor 5 having the capacity $C_1$ and the direct-current capacitor 5 having the capacity $C_2$. However, the same principles can apply to the estimating processing and the life determining processing of a combined capacity, for a three-parallel direct-current capacitor system or a system having more parallel capacitors.

In addition, the above-described commanding unit 13, the current integrating unit 14, the capacity estimating unit 15, the life determining unit 16, the standard-ratio setting unit 17, and the alarm signal outputting unit 18 may be for example configured in the form of a software program, or by a combination of each type of electronic circuits and a software program. When these units and circuitry are configured in the form of a software program for example, each of the above-described functions is realized by operating an arithmetic processing unit in the motor driving apparatus 1 according to this software program. The present invention can also be applied to an existing system, by additionally installing the software program concerning these units and circuitry in the arithmetic processing unit in the motor driving apparatus.

The present invention is a motor driving apparatus that can accurately determine the life of each of a plurality of direct-current capacitors connected in parallel in a direct-current link between a converter and an inverter.

When the invention described in Japanese Unexamined Patent Publication No. 2000-152643 is applied to a motor driving apparatus provided with a plurality of sets made of a motor, an inverter and a direct-current capacitor to correspond to a plurality of driving shafts, it cannot estimate the capacity of each direct-current capacitor, and therefore cannot identify the direct-current capacitor having ended its life, from the plurality of direct-current capacitors. On the contrary, in the present invention, by simultaneously providing power-converting commands to the inverters to command conversion of the direct-current power in the direct-current link into an alternating-current power, in the state in which each direct-current capacitor is charged and in which the supply of direct-current power to the converter from the alternating-current power source is shut off, the capacity of each direct-current capacitor is estimated while preventing movement of a charge between the direct-current capacitor. As a result, the life of each of a plurality of direct-current capacitors can be accurately determined, and it becomes easy to quickly identify the direct-current capacitor having ended its life, from the plurality of direct-current capacitors.

What is claimed is:

1. A motor driving apparatus comprising: a converter converting, into a direct-current power, an alternating-current power supplied from an alternating-current power source side; at least two direct-current capacitors provided in a direct-current link being a direct-current side of the converter and mutually connected in parallel; and at least two inverters respectively connected in parallel with the direct-current capacitors, and converting a direct-current power in the direct-current link into an alternating-current power being a driving power of a motor, the motor driving apparatus characterized by comprising:
    a voltage detecting unit for detecting a voltage for each of the direct-current capacitors;
    a current detecting unit for, for each of the inverters, detecting a current either inputted to or outputted from the inverter;
    a commanding unit for outputting power-converting command to the inverters to command conversion of the direct-current power in the direct-current link into an alternating-current power, after the direct-current capacitors are charged as well as supply of direct-current power from the alternating-current power source side to the converter is shut off;
    a current integrating unit for integrating a current of each of the inverters detected by the current detecting unit while the commanding unit is outputting the power-converting commands, and outputting 30 the result as a current integration value for each of the inverters;
    a capacity estimating unit for calculating an estimated capacity for each of the direct-current capacitors, based on the current integration value corresponding to the inverter corresponding to the direct-current capacitor and a voltage of the direct-current capacitor detected by the voltage detecting unit after supply of the direct-current power to the converter is shut off and before the commanding unit outputs the power-converting commands; and
    a life determining unit for each of the direct-current capacitors, determining whether the direct-current capacitor is at the end of its life based on an initial capacity value of the direct-current capacitor still unused measured in advance and the estimated capacity of the direct-current capacitor calculated by the capacity estimating unit.

2. The motor driving apparatus according to claim 1, wherein
    the life determining unit determines that the direct-current capacitor is at the end of its life, when a ratio of the estimated capacity to the initial capacity is equal to or smaller than a pre-set standard ratio.

3. The motor driving apparatus according to claim 1, wherein
    the life determining unit determines that the direct-current capacitor is at the end of its life, when the estimated capacity is equal to or smaller than a value obtained by multiplying the initial capacity by a pre-set standard ratio.

4. The motor driving apparatus according to claim 2, wherein
    the current detecting unit detects a current outputted from the inverters for each of the inverters, and
    the power-converting commands outputted from the commanding unit command conversion of a direct-current power in the direct-current link to a reactive power.

5. The motor driving apparatus according to claim 2, further comprising:
    a standard-ratio setting unit for setting the standard ratio.

6. The motor driving apparatus according to claim 2, further comprising:
    an alarm signal outputting unit for outputting an alarm signal when the life determining unit has determined that the direct-current capacitor is at the end of its life.

7. The motor driving apparatus according to claim 1, further comprising:
    an initial capacity storage unit having stored therein an initial capacity value of the direct-current capacitor still unused measured in advance.

* * * * *